United States Patent [19]
David et al.

[11] Patent Number: 5,948,166
[45] Date of Patent: Sep. 7, 1999

[54] PROCESS AND APPARATUS FOR DEPOSITING A CARBON-RICH COATING ON A MOVING SUBSTRATE

[75] Inventors: Moses M. David, Woodbury; Donald J. McClure, Shoreview; Stephen P. Maki, North St. Paul, all of Minn.

[73] Assignee: 3M Innovative Properties Company, St. Paul, Minn.

[21] Appl. No.: 08/938,890

[22] Filed: Sep. 26, 1997

Related U.S. Application Data

[63] Continuation-in-part of application No. 08/744,227, Nov. 5, 1996.

[51] Int. Cl.$^6$ .................................................... C23C 16/00
[52] U.S. Cl. .......................... 118/718; 118/729; 118/730; 118/723 E; 156/345
[58] Field of Search ................................. 118/723 E, 723, 118/724, 723 MP, 729, 730; 156/345

[56] References Cited

U.S. PATENT DOCUMENTS

| | | |
|---|---|---|
| 4,479,982 | 10/1984 | Nilsson et al. . |
| 4,532,150 | 7/1985 | Endo ......................................... 427/39 |
| 4,645,977 | 2/1987 | Kurokawa et al. . |
| 4,663,640 | 5/1987 | Ikeda . |
| 4,847,639 | 7/1989 | Sugata et al. . |
| 4,865,711 | 9/1989 | Kittler . |
| 4,890,126 | 12/1989 | Hotomi . |
| 5,052,339 | 10/1991 | Vakerlis ................................. 118/723 |
| 5,073,785 | 12/1991 | Jansen et al. . |
| 5,182,132 | 1/1993 | Murai et al. . |
| 5,203,924 | 4/1993 | Mitani et al. . |
| 5,224,441 | 7/1993 | Felts ....................................... 118/718 |
| 5,227,008 | 7/1993 | Klun et al. . |
| 5,232,791 | 8/1993 | Kohler et al. . |
| 5,286,534 | 2/1994 | Kohler et al. . |
| 5,360,483 | 11/1994 | Kurokawa et al. . |
| 5,443,687 | 8/1995 | Koyama et al. . |
| 5,443,888 | 8/1995 | Murai et al. . |
| 5,464,667 | 11/1995 | Köhler et al. . |
| 5,496,595 | 3/1996 | Ueda et al. . |
| 5,571,332 | 11/1996 | Halpern ........................... 118/723 HC |
| 5,695,832 | 12/1997 | Hirano et al. ........................... 427/577 |
| 5,711,814 | 1/1998 | Mori .................................... 118/723 E |

FOREIGN PATENT DOCUMENTS

| | | |
|---|---|---|
| 664343 | 7/1995 | European Pat. Off. . |
| 62-83471 | 4/1987 | Japan . |
| 3-052937 | 3/1991 | Japan . |
| 4-154960 | 5/1992 | Japan . |
| 5-169459 | 7/1993 | Japan . |
| 2 287 473 | 9/1995 | United Kingdom . |

OTHER PUBLICATIONS

David, M. et al, "Plasma Deposition and Etching of Diamond–Like Carbon Films," *AIChE Journal*, vol. 37, No. 3, pp. 367–376 (Mar. 1991).

Logan, J., "RF Diode Sputter Etching and Deposition," *Handbook of Plasma Processing Technology–Fundamentals, Etching, Deposition, and Surface Interactions*, Part III, Ch. 5, Noyes Publications, Park Ridge, NJ, pp. 140–159 (1990).

*Primary Examiner*—Bruce Breneman
*Assistant Examiner*—Erin Fieler
*Attorney, Agent, or Firm*—Kent S. Kokko

[57] ABSTRACT

A process and apparatus for deposition of a carbon-rich coating onto a moving substrate is provided. The process and apparatus involve the creation of an electric field surrounding a rotatable electrode in a carbon-containing gaseous environment. This results in carbon-rich plasma formation, wherein the electrode is negatively biased with respect to the electrode which results in ion acceleration from the plasma toward the electrode. Ion bombardment continuously occurs on a substrate in contact with the electrode producing a continuous carbon-rich coating over the length of the substrate.

8 Claims, 4 Drawing Sheets

PROCESS AND APPARATUS FOR DEPOSITING A CARBON-RICH COATING ON A MOVING SUBSTRATE

This application is a continuation-in-part of U.S. application Ser. No. 08/744,227, filed Nov. 5, 1996, now pending.

BACKGROUND OF THE INVENTION

1. Field of the Invention

The invention relates to a process of and apparatus for depositing on moving substrates carbon-rich coatings, and more particularly to a process of and apparatus for creating a plasma, the ions of which accelerate toward a substrate and deposit thereon as a carbon-rich coating. Specifically, the invention relates to a process of and apparatus for powering an electrode which causes the creation of a plasma from a carbon-containing gas within an otherwise evacuated chamber containing the electrode. The electrode becomes negatively biased with respect to the plasma, causing positive ions within the plasma to accelerate toward the electrode where they bombard a moving substrate in contact with the electrode, thereby depositing a carbon-rich coating on the substrate.

2. Background Information

Carbon coatings (also called "films") are known to be quite hard, chemically inert, corrosion resistant, and impervious to water vapor and oxygen. Carbon films often are used as mechanical and chemical protective coatings on a wide variety of organic, polymeric, metallic, and semiconductive substrates.

Carbon films can be deposited in a variety of forms having differing physical and chemical properties, e.g., graphite, diamond, diamond-like carbon (DLC), diamond-like hydrocarbon, or amorphous carbon. Carbon film coatings typically contain two types of carbon-carbon bonds: trigonal graphite bonds ($sp^2$) and tetrahedral diamond bonds ($sp^3$). The term "diamond-like carbon" is applied to noncrystalline materials in which tetrahedral bonds predominate. DLC coatings or films have many of the desirable properties of diamond, such as extreme hardness, extremely low electrical conductivity, a low coefficient of friction, and optical transparency over a wide range of wavelengths.

Several techniques for depositing carbon films, using both solid carbon and hydrocarbon sources, have been developed. Among those using a solid carbon source are sputtering, laser evaporation, pulsed discharge rail gun, and cathodic arc deposition. Deposition methods using a hydrocarbon source include ion beam, microwave plasma, RF plasma, and direct current (DC) plasma discharges. In the latter methods, also known as plasma assisted chemical vapor deposition (PCVD), a plasma is generated from a gaseous hydrocarbon source (by microwave, RF, DC, etc.), and the ions thereof are directed toward a biased electrode in intimate contact with the substrate, whereupon a carbon film is built up on the substrate. In general, higher energy impacting species provide coatings having more $Sp^3$ character that are, therefore, more diamond-like.

A number of unit or batch operations for depositing carbon films have been described. Parallel-plate plasma reactors, comprising a grounded electrode and a powered electrode on which a substrate can be located, are available from a variety of commercial sources such as, for example, Plasma-Therm, Inc. (St. Petersburg, Fla.). Depending on the properties of the substrate, the powered electrode can be heated or cooled. Typically, the reactor containing the substrate is evacuated to a relatively low pressure, e.g., approximately 0.13 Pa, after which a hydrocarbon gas is introduced into the reactor. An RF generator delivers power to the powered electrode sufficient to generate a plasma of the hydrocarbon gas. A negative bias voltage on the powered electrode draws positive ions from the plasma toward the electrode for efficient and rapid coating. However, batch vapor deposition devices generally are not suitable for large scale operation or rapid processing of multiple units, as might be required for an industrial operation.

Continuous (i.e., non-interrupted, multiple-unit) carbon-rich film coating processes also have been described. For example, U.S. Pat. Nos. 5,496,595, 5,360,483, 5,203,924 and 5,182,132 (assigned to Matsushita Electric Industrial Co., Ltd.; Osaka, Japan) describe a DC plasma method of coating one or both sides of a magnetic recording tape. A plasma generated from a hydrocarbon gas is impinged on a continuously moving belt or web by means of a plasma-generating tube. Although these coating processes and apparatus are believed to meet the goals and objectives defined therein, application of RF power to a rotatable electrode so as to form a plasma is not described or suggested. Also, the substrate is not described as being in intimate contact with the plasma creating device.

Continuous reel-to-reel jet plasma carbon-rich film coating processes are described in U.S. Pat. Nos. 5,464,667, 5,286,534 and 5,232,791 (assigned to 3M; St. Paul, Minn.). A hollow-cathode DC plasma device generates plasma from a hydrocarbon gas with the ions of the plasma being projected toward a web moving across a RF-biased drum. Although these coating processes and apparatus are believed to meet the goals and objectives defined therein, RF plasma generation is not described or suggested.

Carbon-film deposition from an RF-generated hydrocarbon plasma onto a continuous, moving web is described in Japanese Patent Application (Kokai) 62-83471. A film base is wrapped around a grounded (i.e., non-powered) electrode and high-frequency voltage is applied to a counter electrode spaced from the rotary electrode to generate a plasma.

The above-described methods, while solving some problems, do not address serious deficiencies that prevent economical continuous carbon film deposition in industry. Some of these problems include:

1) In batch processing, the electrical properties of the electrode (the target electrode in RF, the generating electrode in DC) do not remain constant over time. As deposition on a target substrate proceeds, the gradual build-up of carbon coating increases the substrate/electrode capacitance, thus altering the discharge characteristics of the electrode. This leads to a coating process that is inconsistent over time.

2) In batch processes, flaking or delamination of the coating occurs after the coating thickness exceeds some critical minimum value. Flakes are detrimental because they constitute surface blemishes and can be propelled onto other parts of the substrate.

3) In a continuous DC hollow cathode process, a cathode tube that projects hydrocarbon plasma quickly becomes fouled with build-up of carbon-rich material, decreasing cathode efficiency. Over time, substrates coated using a cathode tube become less and less uniform in the downweb direction due to variations in output from the cathode tube.

4) Cathode tubes indiscriminately apply DLC coatings to all surfaces within a vacuum chamber. Not only is this inefficient, it forces frequent cleaning and upkeep of the vacuum chamber.

5) Because of their design, cathode tubes generally cannot coat targets having a width of more than about 30 cm with a coating having acceptable crosswidth uniformity. Industrial processes involving substrates with wider widths would need to be accommodated by use of multiple cathodes for each coating run.

6) Cathode tubes have a natural limitation on the input power used for plasma generation. Above some minimum electrical current, arcing of the carbon electrodes occurs. This causes instability during operation. Thus, higher yields and throughput cannot be achieved merely by increasing power to the cathode.

7) Cathode tubes generate a plasma plume that is approximately the same physical shape as that of the exit orifice of the cathode tube. A three-fold variation in cross-web coating weight has been observed from such a hollow-tube cathode (see, e.g., the aforementioned '667 patent).

8) The same limitations as described in numbers 3–7 above exist in other kinds of discharge tubes, e.g., multiple discharge tubes such as those described in the aforementioned '595 patent and inductively coupled discharge tubes such as those described in U.S. Pat. No. 4,645,977.

The deposition of carbon-rich coatings on moving substrates presents a number of challenges that have not been met by methods and devices described heretofore. An efficient, scalable, continuous (e.g., reel-to-reel) method is highly desirable.

SUMMARY OF THE INVENTION

Briefly, the present invention provides a process for coating a moving substrate with a carbon-rich film that includes the step of, in an environment conducive to carbon-rich film deposition including an electrode in contact with at least in part by a moving substrate, applying power to the electrode so as to create from the environment an ion-containing plasma. The electrode becomes negatively biased with respect to the plasma, thereby accelerating the ions toward the electrode. The ions strike the moving substrate in contact with the electrode, resulting in deposition of a carbon-rich film on the substrate.

In another aspect, the present invention provides a process for depositing a carbon-rich film on a moving substrate that includes the steps of (1) bringing a length of the substrate into contact with an electrode housed within a vacuum chamber and (2) applying power to the electrode so as to generate the carbon-rich film on the length of the substrate in contact with the electrode. Deposition of the carbon-rich film is substantially confined to the moving substrate (i.e., the carbon-rich film is not indiscriminately coated on the various parts of the vacuum chamber).

In a further aspect, the present invention provides an apparatus for coating carbon-rich films on a moving substrate that includes (1) a rotatable electrode housed within an environment conducive to carbon-rich film deposition, the electrode being structured such that at least a portion thereof can contact a length of the substrate; and (2) a power source being electrically connected to the rotatable electrode and capable of powering the electrode. The powered electrode creates from the environment an ion-containing plasma. The ions accelerate toward the electrode causing carbon-rich film deposition on the substrate. Ion acceleration toward the electrode occurs because the powered electrode becomes negatively biased with respect to the plasma, which occurs immediately after plasma creation.

Overall, this new process and apparatus can provide a carbon-rich coating on a moving substrate using only one electrode, a uniform DLC coating, a carbon-rich coating process in which flaking is minimized or eliminated, a coating process that does not require a cathode tube, discriminate coating of substrates rather than indiscriminate coating of the entire evacuated chamber, improved efficiency and reduced waste, reduction or elimination of the need to clean the chamber, continuous (i.e., non-interrupted, multiple-unit) carbon-rich coating, a continuous carbon-rich coating method involving plasma generation from a hydrocarbon gas, a continuous carbon-rich coating method involving ion acceleration due to a negative bias, vapor deposition suitable for large scale operation or rapid processing of multiple units, a continuous reel-to-reel carbon-rich coating process, a continuously applied carbon-rich coating on a substrate where the electrical properties of the electrode remain constant over time (no carbon build-up on substrate or electrode), a carbon-rich coating on substrates of substantial width, and a carbon-rich coating that has essentially no cross web variation in coating weight or thickness.

Unless otherwise explicitly stated, the following definition applies hereinthroughout:

"plasma" means a partially ionized gaseous or fluid state of matter containing electrons, ions, neutral molecules, and free radicals;

"negative bias" means that an object (e.g., an electrode) has a negative electrical potential with respect to some other matter (e.g., a plasma) in its vicinity;

"negative self bias", with respect to an electrode and a plasma, means a negative bias developed by application of power (e.g., radio frequency) to an electrode that creates a plasma;

"contact" or "contacting", with respect to a substrate and an electrode, means touching or within the plasma dark space limit of the electrode (e.g., about 3 mm); and "Substrate" means non-porous sheet, porous sheet, fabric, fiber or combination thereof.

BRIEF DESCRIPTION OF THE DRAWINGS

Embodiments of the present invention are set forth in the following description and shown in the drawings. Similar numerals refer to similar parts throughout the drawings.

DETAILED DESCRIPTION OF PREFERRED EMBODIMENTS

The invention provides a process of and apparatus for depositing carbon rich coatings, some of which can have diamond-like properties, on a substrate by means of plasma creation coupled with ion acceleration resulting in film deposition. In general, carbon rich plasma is created in a carbon containing environment by applying a high-frequency electric field to the environment by powering a rotatable electrode element. Ions within the carbon rich plasma accelerate toward the electrode because the electrode is negatively biased with respect to the plasma. The acceleration causes the ions to strike or bombard a substrate in contact with the rotating electrode. Ion bombardment results in a carbon-rich coating being deposited substantially only on the substrate. These coatings normally are relatively thin; specifically, up to about 10 $\mu$m, preferably up to about 5 $\mu$m, more preferably up to about 1 $\mu$m, and most preferably up to about 0.5 $\mu$m.

The process of the present invention differs from conventional carbon coating processes and apparatuses where plasma creation and ion acceleration are caused by power applied to different elements and where formation of carbon-rich coatings occur on both the substrate and the apparatus rather than essentially just the substrate.

Figure 1:
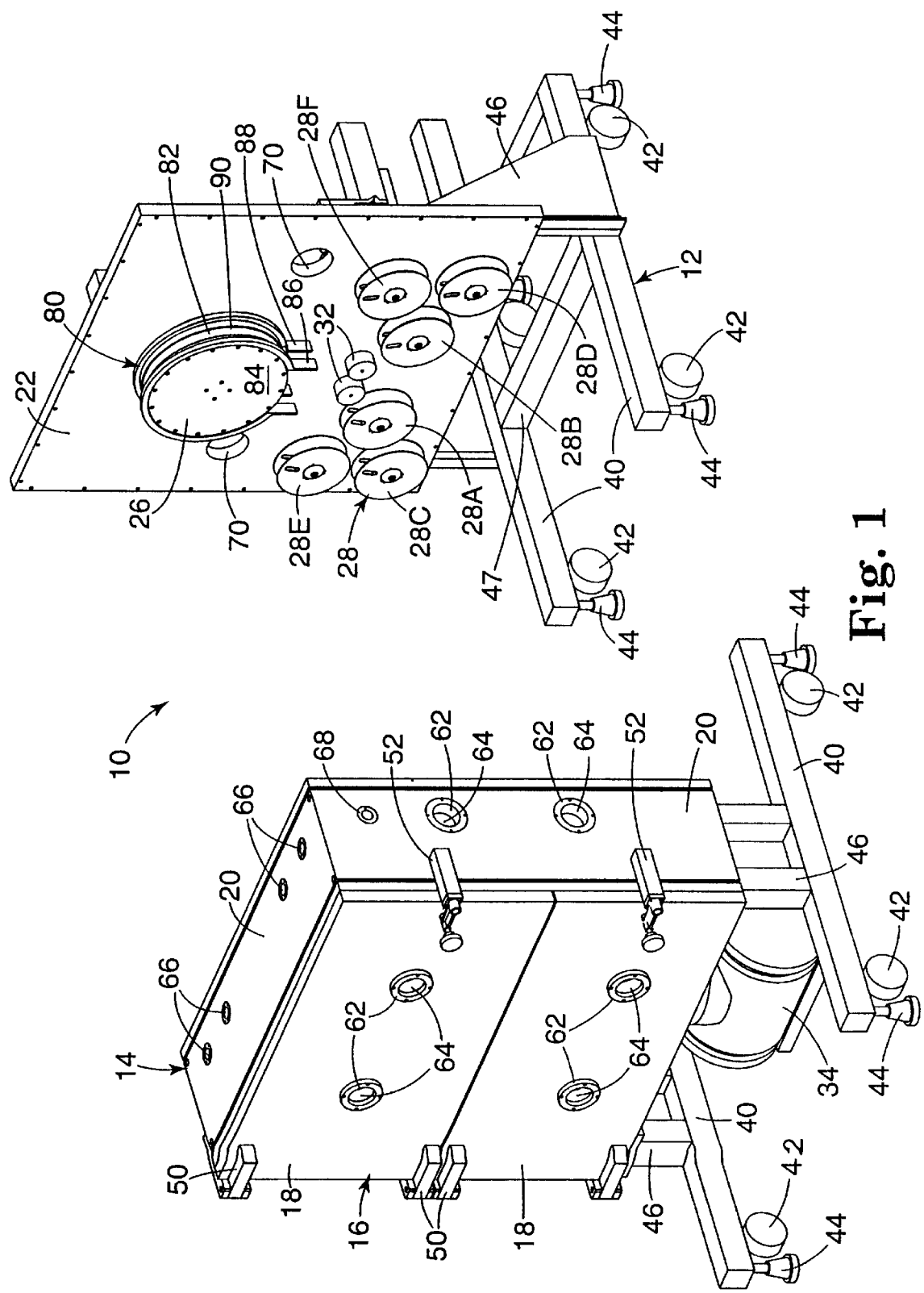
FIG. 1 is a first fragmentary perspective view of one embodiment of the coating apparatus of the present invention.
Figure 2:
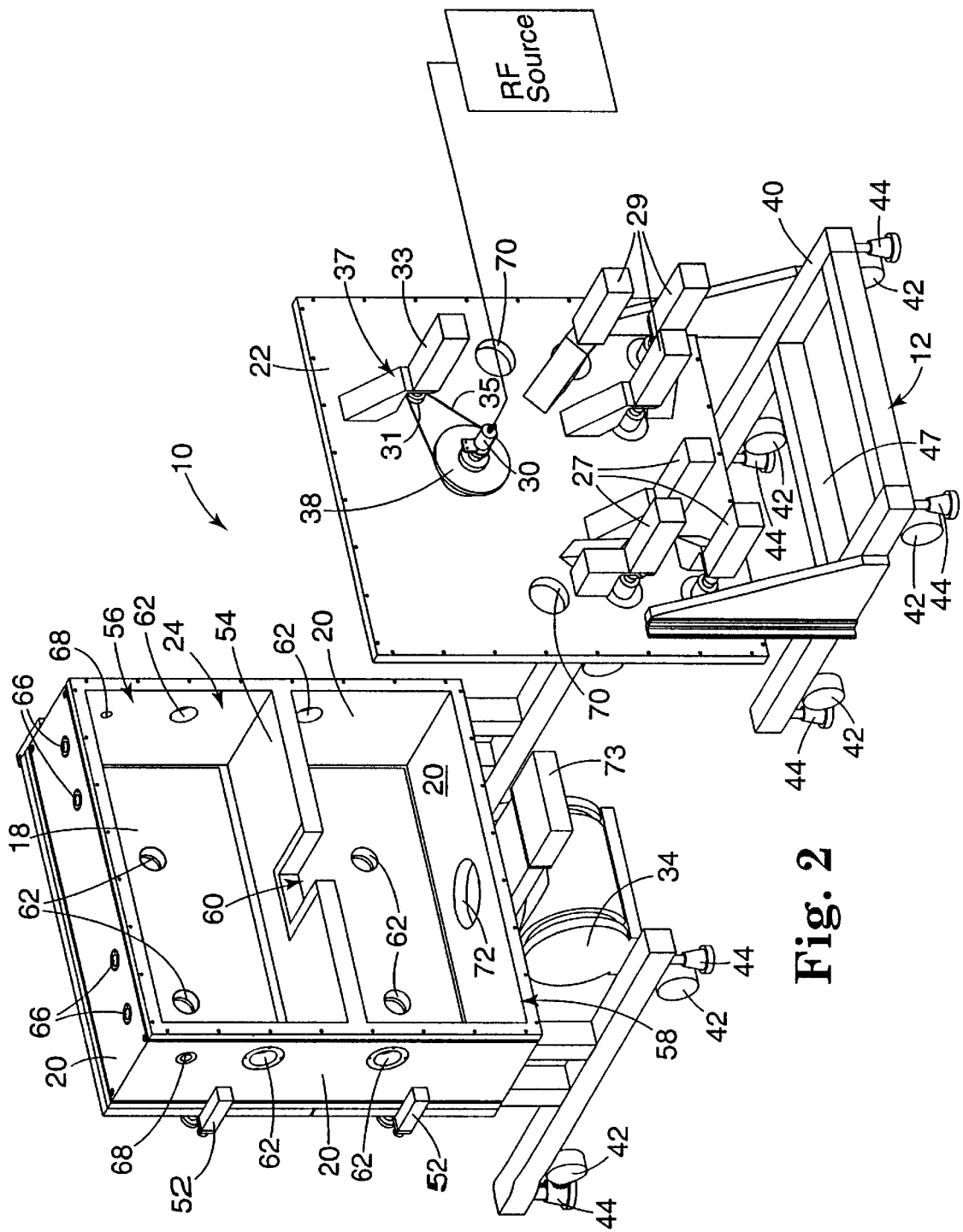
FIG. 2 is a second fragmentary perspective view of the apparatus of FIG. 1 taken from a different vantage point.

Referring to FIGS. 1 and 2, an embodiment of the carbon film deposition apparatus of the present invention with a common element for plasma creation and ion acceleration is generally indicated as 10. This deposition apparatus 10 includes a support structure 12, a housing 14 including a front panel 16 of one or more doors 18, side walls 20 and a back plate 22 defining an inner chamber 24 therein divided into one or more compartments, a drum 26 rotatably affixed within the chamber, a plurality of reel mechanisms rotatably affixed within the chamber and referred to generally as 28, drive mechanism 37 for rotatably driving drum 26, idler rollers 32 rotatably affixed within the chamber, and vacuum pump 34 fluidly connected to the chamber.

Support structure 12 is any means known in the art for supporting housing 14 in a desired configuration, a vertically upright manner in the present case. As shown in FIGS. 1 and 2, housing 14 can be a two-part housing as described below in more detail. In this embodiment, support structure 12 includes cross supports 40 attached to each side of the two-part housing for supporting apparatus 10. Specifically, cross supports 40 include both wheels 42 and adjustable feet 44 for moving and supporting, respectively, apparatus 10. In the embodiment shown in FIGS. 1 and 2, cross supports 40 are attached to each side of housing 14 through attachment supports 46. Specifically, cross supports 40 are connected to one of side walls 20, namely the bottom side wall, via attachment supports 46, while cross supports 40 on the other side of housing 14 are connected to back plate 22 by attachment supports 46. An additional crossbar 47 is supplied between cross supports 40 on the righthand side of apparatus 10 as shown in FIG. 1. This can provide additional structural reinforcement.

Housing 14 can be any means of providing a controlled environment that is capable of evacuation, containment of gas introduced after evacuation, plasma creation from the gas, ion acceleration, and film deposition. In the embodiment shown in FIGS. 1 and 2, housing 14 has outer walls that include front panel 16, four side walls 20, and a back plate 22. The outer walls define a box with a hollow interior, denoted as chamber 24. Side walls 20 and back plate 22 are fastened together, in any manner known in the art, to rigidly secure side walls 20 and back plate 22 to one another in a manner sufficient to allow for evacuation of chamber 24, containment of a fluid for plasma creation, plasma creation, ion acceleration, and film deposition. Front panel 16 is not fixedly secured so as to provide access to chamber 24 to load and unload substrate materials and to perform maintenance. Front panel 16 is divided into two plates connected via hinges 50 (or an equivalent connection means) to one of side walls 20 to define a pair of doors 18. These doors seal to the edge of side walls 20, preferably through the use of a vacuum seal (e.g., an O-ring). Locking mechanisms 52 selectively secure doors 18 to side walls 20 and can be any mechanism capable of securing doors 18 to walls 20 in a manner allowing for evacuation of chamber 24, storage of a fluid for plasma creation, plasma creation, ion acceleration, and film deposition.

In one embodiment, chamber 24 is divided by a divider wall 54 into two compartments 56 and 58. A passage or hole 60 in wall 54 provides for passage of fluids or substrate between compartments. Alternatively, the chamber can be only one compartment or three or more compartments.

Housing 14 includes a plurality of view ports 62 with high pressure, clear polymeric plates 64 sealably covering ports 62 to allow for viewing of the film deposition process occurring therein. Housing 14 also includes a plurality of sensor ports 66 in which various sensors (e.g., temperature, pressure, etc.) can be secured. Housing 14 further includes inlet ports 68 providing for conduit connection through which fluid can be introduced into chamber 24 as needed to supply an environment conducive to film deposition. Housing 14 also includes pump ports 70 and 72 that allow gases and liquids to be pumped or otherwise evacuated from chamber 24.

Pump 34 is shown suspended from one of sides 20, preferably the bottom (as shown in FIG. 2). Pump 34 can be, for example, a turbo-molecular pump fluidly connected to the controlled environment within housing 14. Other pumps, such as diffusion pumps or cryopumps, can be used to evacuate lower chamber 58 and to maintain operating pressure therein. Sliding valve 73 is positioned along this fluid connection and can selectively intersect or block fluid communication between pump 34 and the interior of housing 14. Sliding valve 73 is movable over pump port 62 so that pump port 62 can be fully open, partially open, or closed with respect to fluid communication with pump 34.

Drum 26 preferably is a cylindrical electrode 80 with an annular surface 82 and two planar end surfaces 84. The electrode can be made of any electrically conductive material and preferably is a metal such as, for example, aluminum, copper, steel, stainless steel, silver, chromium or an alloy of any one or more of the foregoing. Preferably, the electrode is aluminum, because of the ease of fabrication, low sputter yield, and low costs.

Drum 26 is further constructed to include non-coated, conductive regions that allow an electric field to permeate outward as well as non-conductive, insulative regions for preventing electric field permeation and thus for limiting film coating to the non-insulated or conductive portions of the electrode. The electrically non-conductive material typically is an insulator, such as a polymer (e.g., polytetrafluoroethylene). Various embodiments that fulfill this electrically non-conductive purpose so as to provide only a small channel, typically the width of the substrate to be coated, as a conductive area can be envisioned by one of ordinary skill in the art.

FIG. 1 shows an embodiment of drum 26 where annular surface 82 and end surfaces 84 of drum 26 are coated with an electrically non-conductive or insulative material, except for annular channel 90 in annular surface 82 which remains uncoated and thus electrically conductive. In addition, a pair of dark space shields 86 and 88 cover the insulative material on annular surface 82, and in some embodiments cover end surfaces 84. The insulative material limits the surface area of the electrode along which plasma creation and negative biasing may occur. However, since the insulative materials sometimes can become fouled by the ion bombardment, dark space shields 86 and 88 can cover part or all of the insulated material. These dark space shields may be made from a metal such as aluminum but do not act as conductive agents because they are separated from the electrode by means of an insulating material (not shown). This allows confinement of the plasma to the electrode area.

Figure 3:
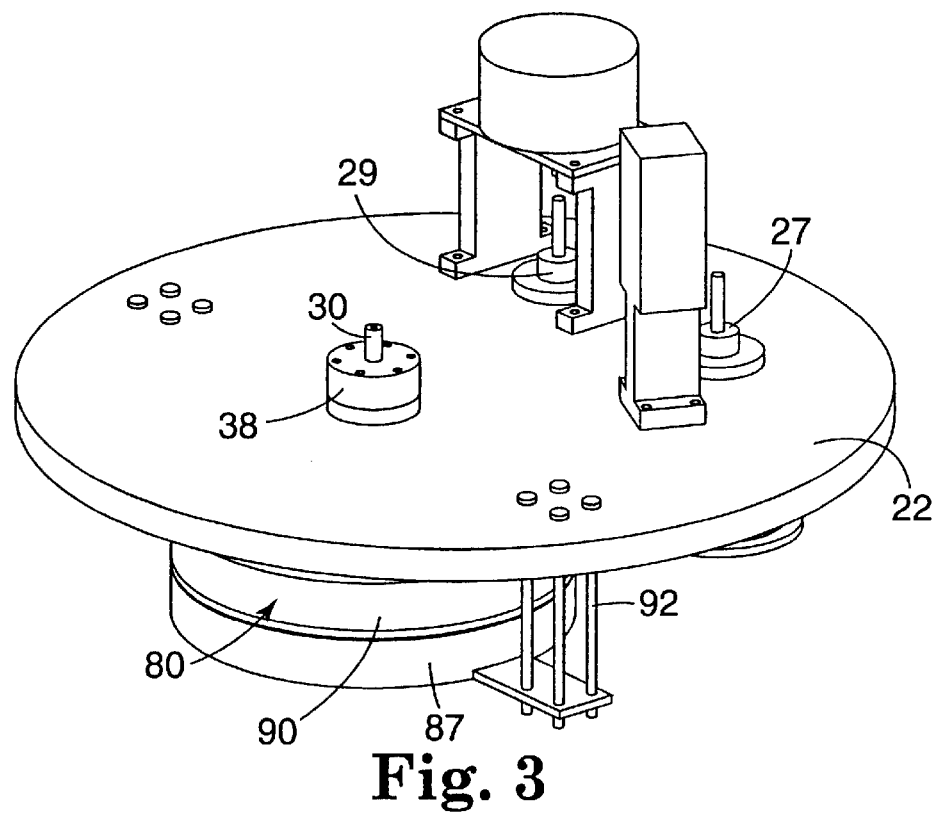
FIG. 3 is a fragmentary perspective view of another embodiment of the coating apparatus of the present invention removed from its gas containing chamber.
Figure 4:
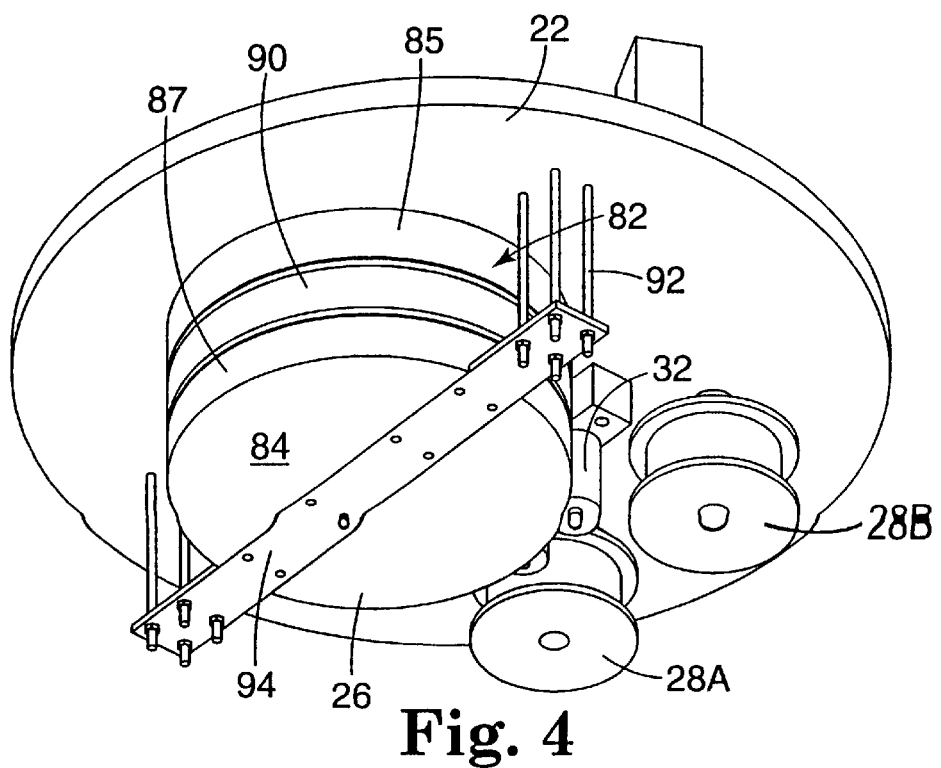
FIG. 4 is a second perspective view of the embodiment of FIG. 3 taken from a different vantage point.

Another embodiment of drum 26 is shown in FIGS. 3 and 4 where drum 26 includes a pair of insulative rings 85 and 87 affixed to annular surface 82 of drum 26. In some embodiments, insulative ring 87 is a cap which acts to also cover end surface 84. Bolts 92 secure support means 94, embodied as a flat plate or strap, to back plate 22. Bolts 92 and support means 94 can assist in supporting the various parts of drum 26. The pair of insulative rings 85 and 87, once affixed to annular surface 82, define an exposed electrode portion embodied as channel 90.

In any case, electrode 80 is covered in some manner by an insulative material in all areas except where the substrate contacts the electrode. This defines an exposed electrode portion that can be in intimate contact with the substrate. The remainder of the electrode is covered by an insulative material. When the electrode is powered and the electrode becomes negatively biased with respect to the resultant plasma, this relatively thick insulative material prevents carbon film deposition on the surfaces it covers. As a result, deposition is limited to the uncovered area (i.e., that which is not covered with insulative material, channel 90), which preferably is covered by relatively thin substrate material.

Referring to FIGS. 1 and 2, drum 26 is rotatably affixed to back plate 22 through a ferrofluidic feedthrough and rotary union 38 (or an equivalent mechanism) affixed within a hole in back plate 22. The ferrofluidic feedthrough and rotary union provide separate fluid and electrical connection from a standard coolant fluid conduit and electrical wire to hollow coolant passages and the conductive electrode, respectively, of rotatable drum 26 during rotation while retaining a vacuum seal. The rotary union also supplies the necessary force to rotate the drum during film deposition, which force is supplied from any drive means such as a brushless DC servo motor. However, connection of drum 26 to back plate 22 and the conduit and wire may be performed by any means capable of supplying such a connection and is not limited to a ferrofluidic feedthrough and a rotary union. One example of such a ferrofluidic feedthrough and rotary union is a two-inch (about 5 cm) inner diameter hollow shaft feedthrough made by Ferrofluidics Co. (Nashua, N.H.).

Drum 26 is rotatably driven by drive assembly 37, which can be any mechanical and/or electrical system capable of translating rotational motion to drum 26. In the embodiment shown in FIG. 2, drive assembly 37 includes motor 33 with a drive shaft terminating in drive pulley 31 that is mechanically connected to a driven pulley 39 rigidly connected to drum 26. Belt 35 (or equivalent structure) translates rotational motion from drive pulley 31 to driven pulley 39.

The plurality of reel mechanisms 28 are rotatably affixed to back plate 22. The plurality of reel mechanisms 28 includes a substrate reel mechanism with a pair of substrate spools 28A and 28B, and, in some embodiments, also can include a spacing web reel mechanism with a pair of spacing web spools 28C and 28D, and masking web reel mechanism with a pair of masking web spools 28E and 28F, where each pair includes one delivery and one take-up spool. As is apparent from FIG. 2, at least each take-up reel 28B, 28D, and 28F includes a drive mechanism 27 mechanically connected thereto such as a standard motor as described below for supplying a rotational force that selectively rotates the reel as needed during deposition. In addition, each delivery reel 28A, 28C, and 28E in select embodiments includes a tensioner for supplying tautness to the webs and/or a drive mechanism 29.

Each reel mechanism includes a delivery and a take-up spool which may be in the same or a different compartment from each other, which in turn may or may not be the same compartment the electrode is in. Each spool is of a standard construction with an axial rod and a rim radially extending from each end defining a groove in which an elongated member, in this case a substrate or web, is wrapped or wound. Each spool is securably affixed to a rotatable stem sealably extending through back plate 22. In the case of spools to be driven, the stem is mechanically connected to a motor 27 (e.g., a brushless DC servo motor). In the case of nondriven spools, the spool is merely coupled in a rotatable manner through a coupling 29 to back plate 22 and may include a tension mechanism to prevent slack.

A preferred type of substrate is a flexible web. Common examples include polymeric (e.g., polyester, polyamide, polyimide, polycarbonate, polyurethane, or polyolefin) webs and webs having at least one surface thereof that includes a metallized coating, such as can be used to define one or more electrical circuits. (See, e.g., U.S. Pat. No. 5,227,008 for a description of such a membrane.) When a spool of the latter type of web is used, the process and apparatus of the present invention can apply a carbon-rich coating (e.g., a DLC coating) to one surface of the entire length of the web. Thus, the web or any material coated thereon, such as an electrical circuit, can be protected by a uniform coating of a carbon-rich material.

Figure 5:
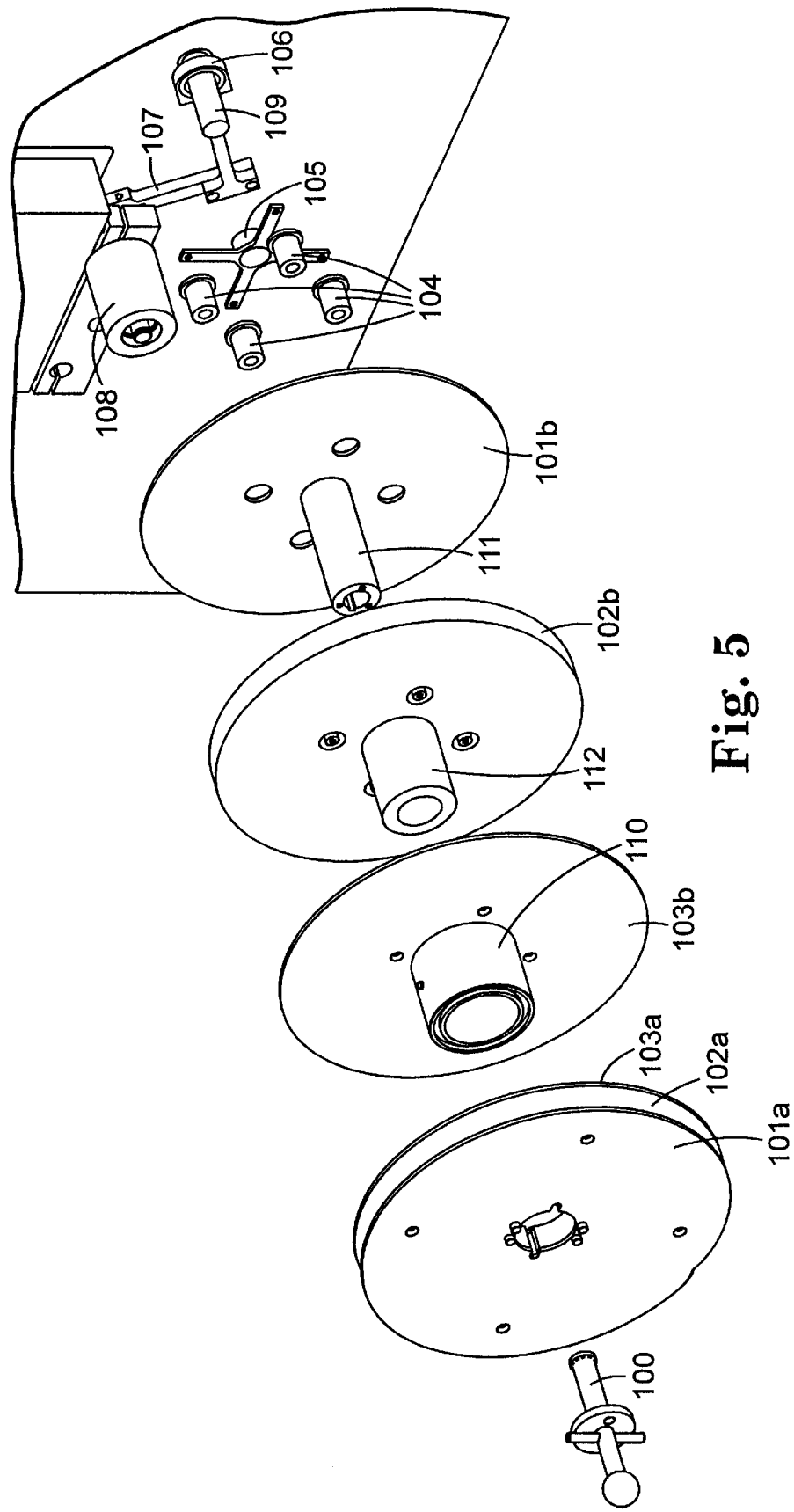
FIG. 5 is a fragmentary perspective view of another embodiment of the coating apparatus of the present invention.

In another embodiment, heat build-up on the substrate under prolonged running conditions can be minimized by the use of Faraday cages and electrically conducting idler rolls. The Faraday cage and electrically conductive idler roll placement are shown in FIG. 5. A Faraday cage is attached to and surrounding the substrate spools 28A and 28B. The Faraday cage is comprised of front and rear copper backing plates 103a and 103b respectively attached to aluminum hub 110. Either of the substrate spools 28a or 28b is slid over the aluminum hub 110 and the front copper plate 103a is secured in place by means of a spring-loaded attachment handle 100. Stray electrical current is shunted from the substrate by contacting the substrate to an electrically conducting idler roll 108, through a shunting bar 107, rotary bushing 106, electrical distributor 105 and into to the backplate 103b of the Faraday cage. The Faraday cage is also substantially enclosed in a grounded enclosure formed by the front and rear copper plates 101a and 101b, and aluminum hub 111. The grounded aluminum hub 111 is attached to the drive shaft 109 passing through the backplate 22 of the apparatus. Plastic bushings 104, plastic plates 102a and 102b, and plastic hub 112 enable electrical isolation of the Faraday cage (formed by copper plates 102a, 102b and aluminum hub 110) from the grounding enclosure (formed by copper plates 101a, 101b and aluminum hub 111).

Film deposition apparatus 10 also includes idler rollers 32 rotatably affixed within the chamber and pump 34 fluidly connected to the chamber. The idler rollers guide the substrate from the deposition substrate spool 28A to channel 90 on drum 26 and from channel 90 to take-up substrate spool 28B. In addition, where spacing webs and masking webs are used, idler rollers 32 guide these webs and the substrate from deposition substrate spool 28A and deposition masking web spool 28E to channel 90 and from channel 90 to take-up substrate spool 28B and take-up masking web spool 28F, respectively.

Film deposition apparatus 10 further includes a temperature control system for supplying temperature controlling fluid to electrode 80 via ferrofluidic feedthrough 38. The temperature control system may be provided on apparatus 10 or alternatively may be provided from a separate system and pumped to apparatus 10 via conduits so long as the temperature control fluid is in fluid connection with passages within electrode 80. The temperature control system may heat or cool electrode 80 as is needed to supply an electrode of the proper temperature for film deposition. In a preferred embodiment, the temperature control system is a coolant system using a coolant such as, for example, water, ethylene glycol, chlorofluorocarbons, hydrofluoroethers, and liquified gases (e.g., liquid nitrogen).

Film deposition apparatus 10 also includes an evacuation pump fluidly connected to evacuation port(s) 70. This pump may be any vacuum pump, such as a Roots blower, a turbo molecular pump, a diffusion pump, or a cryopump, capable of evacuating the chamber. In addition, this pump may be assisted or backed up by a mechanical pump. The evacuation pump may be provided on apparatus 10 or alternatively may be provided as a separate system and fluidly connected to the chamber.

Film deposition apparatus 10 also includes a fluid feeder, preferably in the form of a mass flow controller that regulates the fluid used to create the thin film, the fluid being pumped into the chamber after evacuation thereof. The feeder may be provided on apparatus 10 or alternatively may be provided as a separate system and fluidly connected to the chamber. The feeder supplies fluid in the proper volumetric rate or mass flow rate to the chamber during deposition. In a preferred embodiment, the film created is a thin carbon film having diamond-like properties. This film is created from a gas, supplied by the feeder, that contains molecules that include carbon atoms. Hydrocarbons are particularly preferred, although such species as buckminsterfullerenes, cyanide, tetramethylsilane, and halogenated carboncontaining gases such as fluorocarbons, chlorocarbons, and chlorofluorocarbons also are potentially useful. Hydrocarbons particularly useful for rapid carbon-rich (DLC) coatings include benzene, methylcyclopentadiene, butadiene, pentadiene, styrene, naphthalene, and azulene. Gases with low ionization potentials, that is 10 eV or less, can be used and preferably are used for continuous deposition of carbon-rich coating in this process.

Film deposition apparatus 10 also includes a power source electrically connected to electrode 80 via electrical terminal 30. The power source may be provided on apparatus 10 or alternatively may be provided on a separate system and electrically connected to the electrode via electrical terminal (as shown in FIG. 2). In any case, the power source is any power generation or transmission system capable of supplying sufficient power. (See discussion infra.)

Although a variety of power sources are possible, radio frequency (RF) power is preferred. This is because the frequency is high enough to form a self bias on an appropriately configured powered electrode but not high enough to create standing waves in the resulting plasma, which would be inefficient for ion deposition. RF power is scalable for high coating output (wide webs or substrates, rapid web speed). When RF power is used, the negative bias on the electrode is a negative self bias, i.e., no separate power source need be used to induce the negative bias on the electrode. Because RF power is preferred, the remainder of this discussion will focus exclusively thereon.

The RF power source powers electrode 80 with a frequency in the range of 0.01 to 50 MHz, preferably 13.56 MHz or any whole number (e.g., 1, 2, or 3) multiple thereof. This RF power as supplied to electrode 80 creates a carbon rich plasma from the hydrocarbon gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an RF plasma the powered electrode becomes negatively biased relative to the plasma. This bias is generally in the range of 500 to 1400 volts. This biasing causes ions within the carbon-rich plasma to accelerate toward electrode 80. Accelerating ions form the carbon-rich coating on the substrate in contact with electrode 80 as is described in more detail below.

In operation, a full spool of substrate upon which deposition is desired is inserted over the stem as spool 28A. Access to these spools is provided through lower door 18 since, in FIGS. 1 and 2, the spools are located in lower compartment 58 while deposition occurs in upper compartment 56. In addition, an empty spool is fastened opposite the substrate holding spool as spool 28B so as to function as the take-up spool after deposition has occurred on the substrate.

If a spacer web is desired to cushion the substrate during winding or unwinding, spacer web delivery and/or take-up spool can be provided as spools 28C and 28D (although the location of the spools in the particular locations shown in the figures is not critical). Similarly, if film deposition is desired in a pattern or otherwise partial manner, a masking web can be positioned on an input spool as spool 28E and an empty spool is positioned as a take-up spool as spool 28F.

After all of the spools with and without substrates or webs are positioned, the substrate on which deposition is to occur (and any masking web to travel therewith around the electrode) are woven or otherwise pulled through the system to the take-up reels. Spacer webs generally are not woven through the system and instead separate from the substrate just before this step and/or are provided just after this step. The substrate is specifically wrapped around electrode 80 in channel 90 thereby covering the exposed electrode portion. The substrate is sufficiently taut to remain in contact with the electrode and to move with the electrode as the electrode rotates so a length of substrate is always in contact with the electrode for deposition. This allows the substrate to be coated in a continuous process from one end of a roll to the other. The substrate is in position for film deposition and lower door 18 is sealed closed.

Chamber 24 is evacuated to remove all air and other impurities. Once a carbon-containing fluid, preferably a gas, is pumped into the evacuated chamber, the apparatus is ready to begin the process of film deposition.

The RF power source is activated to provide an RF electric field to electrode 80. This RF electric field causes the carbon-containing material to become ionized, resulting in the formation of a carbon rich plasma with ions therein. This is specifically produced using a 13.56 MHz oscillator, although other RF sources and frequency ranges may be used.

Once the plasma has been created, a negative DC bias voltage is created on electrode 80 by continuing to power the electrode with RF power. This bias causes ions to accelerate toward non-insulated electrode portion 90 of electrode 80 (the remainder of the electrode is either insulated or shielded). The ions bombard the length of substrate in contact with channel 90 of electrode 80 causing a densification of carbon resulting in the deposition of a thin diamond-like carbon film on that length of substrate.

For continuous deposition, the take-up spools are driven so as to pull the substrate and any masking webs through the upper compartment 54 and over electrode 80 so that deposition occurs on any unmasked substrate portions in contact with annular channel 90 (otherwise, the masking web receives the carbon film). The substrate is thus pulled through the upper compartment continuously while a continuous RF field is placed on the electrode and sufficient carbon-containing gas is present within the chamber. The result is a continuous carbon-rich coating on an elongated substrate, and substantially only on the substrate. Carbon film deposition does not occur on the insulated portions of the electrode nor does deposition occur elsewhere in the chamber, because only the electrode is biased. In addition, since the non-insulated portion of the electrode (i.e., annular channel 90) is covered almost or entirely by the substrate, little or no deposition occurs anywhere but on the substrate. This eliminates the need for frequent cleaning of the chamber and parts thereof and replacing the electrode due to carbon buildup. In cases where fouling of the insulated portion occurs, dark space shields 86 and 88 can be provided to prohibit or reduce fouling. Dark space shields 86 and 88 can be of any shape, size, and material that is conducive to the reduction of potential fouling. In the embodiment shown in FIGS. 1 and 2, dark space shields 86 and 88 are metal rings that fit over drum 26 and the insulation thereon. Dark space shields 86 and 88 do not bias due to the insulative material that covers drum 26 in the areas where dark space shields 86 and 88 contact drum 26. The dark space shields in this ring-like embodiment further include tabs on each end thereof extending away from drum 26 in a non-annular manner. These tabs can assist in aligning the substrate within channel 90.

Preferably, the temperature control system pumps fluid through electrode 80 throughout the process to keep the electrode at a desired temperature. Typically, this involves cooling the electrode with a coolant as described above, although heating in some cases may be desirable. In addition, since the substrate is in direct contact with the electrode, heat transfer from the plasma to the substrate is managed through this cooling system, thereby allowing the coating of temperature sensitive films such as polyethyleneterephthalate, polyethylene naphthalate, and the like.

After completion of the deposition process, the spools can be removed from shafts supporting them on the wall. The substrate with a carbon-rich film thereon is on spool 28B and is ready for use wherever thin carbon film coatings are used, such as for electrical isolation for chip cooling, flex-metal circuitry, fiber optics, optical coatings, photo- and microlithographic masks, recording heads and media, printer heads, orthodontia, abrasives, orthopedic implants, thin film capacitors, packaging films, laser device mounts, and numerous other uses.

The result is an apparatus and process that provides a diamond-like or similar carbon-rich film on a substrate with many advantages over the prior art. Low ionization potential gases can be used to obtain extremely high deposition rates while still maintaining good properties in the thin carbon film. By using low ionization potential gases, very fast deposition is possible and low DLC coating film stress is produced. The DLC coating film stress is 0.4 GPa or lower, in comparison to 1 to 10 GPa for the DLC film stress reported in previous DLC coatings. Mass deposition on the substrate is at rates up to forty or more times higher than the prior art rates of deposition. Minimal deposition occurs anywhere except on the substrate, and, as a result, minimal flaking occurs. Furthermore, deposition is almost entirely due to ion bombardment rather than a mixture of ion bombardment and free radical contact. In addition, very high conversion yields (as much as 35%) of gas input to film output, in comparison to typically single digit yields in the prior art, can be obtained.

Other benefits and advantages include the ability to coat over a broader range of substrate dimensions including widths ranging from fibers to films of more than one meter. When the substrate is a porous sheet, fabric or fiber, preferably a sacrificial non-porous sheet is placed between the substrate and electrode 20 to prevent carbon-rich film from accumulating on the electrode and subsequently flaking off. Substrate width is not a limiting factor since ion bombardment comes from all around the substrate in the chamber rather than from a source specific area. According to the method of the present invention, a substrate can be coated to a thickness up to about 0.2 $\mu$m at a rate of approximately 1.5 to 6 m/min, generally without regard to substrate width. Coating thicknesses in the range of 0.1 to 0.3 $\mu$m can be produced easily using this process, although thicker (i.e., up to about 10 $\mu$m) and thinner coatings also are possible.

Overall, plasma generation and ion acceleration is greatly simplified. Only one electrode is used rather than a source electrode and a target electrode. The powered electrode both creates the plasma and becomes negatively biased, thereby accelerating ions within the plasma toward itself for bombardment of the substrate in contact with itself. This DC biasing voltage also serves to density the deposited coating, which enhances the DLC properties.

Accordingly, the coating process and apparatus of the present invention is simplified, provides an effective, safe, inexpensive, and efficient device which eliminates difficulties encountered with prior devices, solves problems, and obtains improved results.

In the foregoing description, certain terms have been used for brevity, clarity, and understanding. No unnecessary limitations are to be implied therefrom beyond the requirement of the prior art because such terms are used for descriptive purpose and are intended to be broadly construed. Moreover, the description and illustration of the invention is by way of example, and the scope of the invention is not limited to the exact details shown or described.

Having now described the features, discoveries and principles of the invention, the manner in which the process and apparatus is constructed and used, the characteristics of the construction, and the advantageous, new and useful results obtained, the new and useful structures, devices, elements, arrangements, parts, and combinations, are set forth in the appended claims.

We claim:

1. An apparatus for depositing a carbon-rich film on a moving flexible web substrate, said apparatus comprising:
   a) a rotatable electrode housed within a chamber suitable for coating in a vacuum, said electrode being structured such that at least a portion thereof can contact a length of said flexible web substrate;
   b) a means to limit coating to said substrate, said means consisting essentially of conductive and non-conductive regions on said electrode, and
   c) a power source electrically connected to said rotatable electrode, said power source being capable of powering said electrode so as to create a plasma comprising ions from a gas containing molecules which include carbon atoms, whereby said electrode becomes negatively biased with respect to said plasma.

2. The apparatus of claim 1 wherein said non-conductive regions define an electrically conductive annular channel on said electrode and wherein said flexible web substrate covers said annular channel.

3. The apparatus of claim 1 further comprising dark space shields covering at least a portion of said non-conductive regions.

4. The apparatus as set forth in claim 1 wherein said chamber includes electrically grounded walls with said electrode positioned within said chamber.

5. The apparatus as set forth in claim 4 wherein said chamber includes a deposition compartment and a substrate storage compartment separated by a divider having a substrate passage therein.

6. The apparatus as set forth in claim 1 wherein said rotatable electrode is temperature controlled.

7. The apparatus as set forth in claim 1 wherein said power source is a radio frequency power source.

8. The apparatus as set forth in claim 5 further comprising a delivery and a take-up substrate spool attached to the substrate compartment, a Faraday cage attached to and surrounding each of the substrate spools, an electrically conductive idler roll paired with each substrate spool, and a means for electrically shunting stray currents through the idler roll to the Faraday cage.

* * * * *